US010386405B2

(12) United States Patent
Roberts, Jr.

(10) Patent No.: US 10,386,405 B2
(45) Date of Patent: Aug. 20, 2019

(54) METHOD FOR CONTINUOUS TESTER OPERATION DURING MULTIPLE STAGE TEMPERATURE TESTING

(71) Applicant: CELERINT, LLC, New York, NY (US)

(72) Inventor: Howard H. Roberts, Jr., Austin, TX (US)

(73) Assignee: CELERINT, LLC, New York, NY (US)

( * ) Notice: Subject to any disclaimer, the term of this patent is extended or adjusted under 35 U.S.C. 154(b) by 101 days.

(21) Appl. No.: 15/569,255

(22) PCT Filed: Aug. 2, 2017

(86) PCT No.: PCT/US2017/045143
§ 371 (c)(1),
(2) Date: Oct. 25, 2017

(87) PCT Pub. No.: WO2018/026946
PCT Pub. Date: Feb. 8, 2018

(65) Prior Publication Data
US 2018/0313888 A1    Nov. 1, 2018

Related U.S. Application Data

(60) Provisional application No. 62/370,355, filed on Aug. 3, 2016.

(51) Int. Cl.
*G01R 31/26*     (2014.01)
*G01R 1/04*      (2006.01)
(Continued)

(52) U.S. Cl.
CPC .......... *G01R 31/2601* (2013.01); *G01R 1/04* (2013.01); *G01R 1/0458* (2013.01); *G01R 31/26* (2013.01);
(Continued)

(58) Field of Classification Search
CPC .......... G01R 1/04; G01R 31/26; G01R 31/28; G01R 31/319; G01R 31/3193;
(Continued)

(56) References Cited

U.S. PATENT DOCUMENTS 9,818,631 B2    11/2017   Roberts, Jr. et al.
2003/0126534 A1   7/2003   Roy et al.
(Continued)

FOREIGN PATENT DOCUMENTS

WO    2015/081081    6/2015

OTHER PUBLICATIONS

International Search Report and Written Opinion, dated Oct. 12, 2017 by the U.S. Patent and Trademark Office (USPTO), in International Patent Application No. PCT/US2017/045143.

*Primary Examiner* — Melissa J Koval
*Assistant Examiner* — Courtney G McDonnough
(74) *Attorney, Agent, or Firm* — Greenblum & Bernstein, P.L.C.

(57) ABSTRACT

A method is provided for performing continuous single insertion semiconductor testing of a group of semiconductors that are divided into a first subgroup and a second subgroup at multiple different temperatures. The single insertion semiconductor testing is performed by sequentially executing testing cycles, characterized by the tester alternately executing temperature testing periods and temperature ramping periods for the first subgroup, while simultaneously executing temperature ramping periods and temperature testing periods for the second subgroup. The temperature testing periods operate at two or more different temperatures. The single insertion testing sequence entirely eliminates tester index time when the testing time is equal to or greater than the ramping times, and substantially reduces tester index time when the testing time is less that the ramping times.

20 Claims, 5 Drawing Sheets

(51) Int. Cl.
  *G01R 31/28* (2006.01)
  *G11C 29/56* (2006.01)
  *H01L 21/687* (2006.01)
  *G11C 29/50* (2006.01)
(52) U.S. Cl.
  CPC ....... *G01R 31/287* (2013.01); *G01R 31/2837* (2013.01); *G01R 31/2849* (2013.01); *G01R 31/2867* (2013.01); *G01R 31/2874* (2013.01); *G01R 31/2882* (2013.01); *G11C 29/56008* (2013.01); *G11C 29/56012* (2013.01); *G11C 29/56016* (2013.01); *H01L 21/68707* (2013.01); *G11C 2029/5002* (2013.01)
(58) Field of Classification Search
  CPC .............. G01R 1/0458; G01R 31/2601; G01R 31/2837; G01R 31/2849; G01R 31/2867; G01R 31/287; G01R 31/2874; G01R 31/2882; G11C 29/48; G11C 29/56008; G11C 29/56012; G11C 29/56016; G11C 2029/5002; H01L 21/68707
  USPC ..................................................... 324/762.01
  See application file for complete search history.

(56) References Cited

U.S. PATENT DOCUMENTS

| | | |
|---|---|---|
| 2011/0204914 A1 | 8/2011 | Roberts |
| 2014/0046613 A1 | 2/2014 | Roberts, Jr. |
| 2014/0077829 A1 | 3/2014 | Oh et al. |
| 2016/0293461 A1 | 10/2016 | Roberts, Jr. et al. |

METHOD FOR CONTINUOUS TESTER OPERATION DURING MULTIPLE STAGE TEMPERATURE TESTING

CROSS-REFERENCE TO RELATED APPLICATION

This application claims the benefit of U.S. Provisional Patent Application No. 62/370,355, entitled "Method for Continuous Tester Operation During Multiple Stage Temperature Testing," filed on Aug. 3, 2016, the disclosure of which is incorporated by reference herein in its entirety.

TECHNICAL FIELD

The present disclosure is related to automated manufacturer systems and methods, particularly automated semiconductor test equipment and robotic handlers. In particular, the present disclosure is related to optimizing the configuration and methodology of operating automated semiconductor test equipment and robotic handlers to achieve nearly continuous semiconductor tester operation during multiple stage temperature testing of semiconductors. As a result of reduced index timing delays, the overall total testing time is minimized, which optimizes semiconductor testing throughput.

BACKGROUND

Manufacturing and production industries use automatic test equipment (ATE) to analyze and assess integrity and operability of manufactured products at various stages of production. Robotic manipulator machines are often employed during testing by ATE to manipulate work pieces and products into and out of connection with the ATE. The semiconductor devices under test (DUTs) are presented to a test site of the ATE by the robotic machine, tested by the ATE, and then sorted and dispensed by the robotic machine into groups or bins (or otherwise according to an applicable scheme) according to test results. Because many diverse types of DUTs are tested by ATEs, and DUTs may be tested at various stages of production (e.g., final test, work piece probe, etc.), ATEs are varied in design according to the particular purpose, device, and/or product for testing. Similarly, robotic manipulator machines vary according to application and compatibility with the ATE.

Although varied, ATEs and robotic manipulators each usually include several typical operational units. ATEs and robotic manipulators are widely used, for example, in the production of electronic products, such as analog and digital components, circuits and devices (including semiconductors, integrated circuits, microprocessors, and the like). Because of this prevalence, the typical operational units of ATEs and robotic manipulators for such products are described.

The ATE includes a system controller, which controls the system and movement of data into and out of the system. The ATE also includes test data and test program storage, pattern memory, system power supplies, direct current reference supply unit, analog current reference supply unit, system clocks and calibration circuits, timing and time set memory, and precision measurement units (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board) connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and controllers. The mechanical systems physically deliver DUTs for presentation to the socket(s) of the DIB connected to the test head of the ATE, deposit the DUTs in the socket(s) during testing, remove the DUTs from the socket(s) post testing, and sort the DUTs according to respective test result after testing. The controller directs operations of the mechanical systems of the handler and communicates with the ATE. As required, handlers can include additional features of memory and specific units according to application and testing environment.

In conventional testing of devices by an ATE and mechanical manipulation of devices by a handler, the ATE commences testing each device when deposited by the handler in a socket of the DIB connected to the test head. When testing is completed, the handler must remove the tested device from the socket and transport a next device to the socket for testing. The time delay between testing by the ATE, during which devices are removed and transported from sockets and next devices are transported to and deposited in sockets, is referred to as "index time" for the test operation. Further, in conventional testing of devices by an ATE, the time required to test each device once deposited in a socket is referred to as "tester time" for the test operation. When testing a batch of devices, the total time required for the testing operation is the aggregate of the index time plus the tester time for all of the devices. Each device (or set of devices, if more than one device can be concurrently tested by the ATE in available sockets of the DIB) requires the sum of the index time plus the tester time for testing of the device. Although testing operations can also require additional time, for example, because of downtime of equipment, faults, or other impediments to continuous testing sequence, these are irregular and uncertain events that are not necessarily controllable.

Therefore, reducing the total test time (index time plus tester time) is desirable. Testing operations can require significant amounts of time, effort, and expense, such as for personnel, ATE, and handler equipment. ATEs are typically expensive because they are comprised of complex electronics. Handlers are generally less expensive than ATEs because mechanical pieces are controlled by less complex electronics. In efforts to receive greater returns on investments in ATEs and handlers, companies operating the equipment desire that idle times (periods of no testing) for this equipment be limited. Therefore, with ATEs and handlers, a reduction of total test time (index time plus tester time) can provide significant advantage. For example, if total test time is reduced, more testing can be performed by each piece of equipment and testing personnel during any period, leading to a greater investment return.

A primary focus in handler development has been to increase the speed of mechanical structures, such as arms, chucks, guides, cams and the like, in order to obtain shorter index times. Because handlers are generally less expensive than ATEs, older handler models are replaced with newer, speedier models. Older handlers become idle and obsolete. Handler mechanical failure is a significant source of testing downtime; therefore, excess handlers are often maintained as backup equipment, but stand idle during periods not in use with ATE for testing operations. It would be desirable to reduce total test time by the more effective and efficient use of ATEs and available handlers.

It would, therefore, be advantageous to reduce total test time for testing by reducing index time of handler/robotic manipulator operations. It would also be advantageous to efficiently use ATE resources and available handlers to put to use idle equipment, maximize use of equipment capabilities, take advantage of available capacity (including capacity from existing older equipment), and consequently, provide a better return on investment. Therefore, a platform system for reducing total test time, by decreasing handler index time and efficiently using automatic test equipment resources, would be a significant improvement in the art and technology.

Frequently, semiconductors need to be tested at different temperatures to insure operational effectiveness and efficiency of the semiconductor. Testing semiconductors at multiple temperatures during a single semiconductor test insertion provides several benefits. Single semiconductor testing is characterized by inserting the semiconductor into a testing socket at the handler testing site and performing multiple tests at different temperatures before removing the semiconductor from the testing socket at the handler testing site. However, conventional testing protocols for testing have been characterized by significant amounts of index time. A representative example of a conventional testing protocol for testing semiconductors at different temperatures is illustrated in Prior Art FIG. 1.

Prior Art FIG. 1 illustrates a simple single test insertion protocol, whereby testing is performed at three different temperatures. More specifically, in the illustrated example, the testing sequence is to first perform a cold temperature test, to secondly perform a room temperature test, and to lastly perform a hot temperature test. The actual temperatures for these tests would be dependent upon the particular testing protocol being utilized. Ramp time, which is illustrated as "ramp," refers to an indexing time period in which the handler ramps to one of selected multiple testing temperature different from the preceding temperature. In other words, ramping refers to increasing or decreasing the temperature level from one testing temperature level to a different testing temperature level, while the semiconductor device remains inserted into a testing socket, but is not being tested. In this instance, time spent by the handler ramping from one testing temperature to another testing temperature is characterized as index time, i.e., time when the tester is idle and is not performing testing.

Again referring to Prior Art FIG. 1, the illustrated sequence begins with a ramp period wherein the handler ramps from an initial temperature, which is frequently the testing room (i.e., ambient) temperature, to a cold temperature so that a cold test can be performed. Upon completion of the cold test, the sequence ramps the temperature to room temperature so that a room temperature test can be performed. Upon completion of the room test, the sequence ramps to a hot temperature so that a hot test can be performed. Upon completion of the hot test, the sequential testing is complete for a first insertion cycle. In order to begin the second insertion cycle, the sequence ramps from the completed hot test in the first insertion cycle to the cold temperature so that the cold test for the second insertion cycle can be performed. The number "n" of insertion cycles for a particular test is determined by the size of the lot of the semiconductor devices to be tested divided by the degree of testing parallelism, which refers to the number of semiconductor devices that can be tested simultaneously by the tester and handler.

As described above in reference to Prior Art FIG. 1, for each semiconductor insertion cycle, which corresponds to one three-temperature testing sequence, there are three ramping periods that are characterized as index time wherein the tester is idle. Thus, the total time spent ramping while testing the entire lot of semiconductor devices is the accumulation of the time accrued during the three ramping period in each insertion cycle multiplied by the number of required insertion cycles. Dependent upon the capabilities of the handler, this total ramp time can be a significant source of inefficiency of the tester and handler that counteracts the benefits of conducting a single insertion test.

SUMMARY

As discussed above, semiconductors need to be tested at different temperatures to insure operational effectiveness and efficiency. Testing semiconductors at multiple temperatures during a single semiconductor test insertion provides several benefits, if the cumulative index time can be either minimized, or ideally, totally eliminated.

In view of these operational considerations, there is provided an innovative methodology for performing continuous semiconductor tester operation using multiple temperatures during a single insertion semiconductor test. This methodology is characterized by substantially reducing index time, and in some operational configurations, entirely eliminating index time. More specifically, the testing protocol is configured such that multiple testing sequences of semiconductors are executed in parallel, while the index associated with the ramping periods is either substantially reduced or eliminated entirely. A system for implementing this methodology is also provided.

In an embodiment, a method is provided for performing semiconductor testing at multiple temperatures during a single insertion semiconductor sequence at the handler testing site. The method includes dividing a group of semiconductors having an ambient temperature into a first subgroup having a plurality of portions and a second subgroup having a plurality of portions. The method also includes during a first testing period, inserting a first portion of the first subgroup into a first handler test site, and inserting a first portion of a second subgroup into a second handler test site; and during a second testing cycle, testing the first portion of the first subgroup at a first testing temperature, which is the ambient temperature. Additionally, the method includes during a third testing cycle, ramping the first portion of the first subgroup from the first testing temperature to a second testing temperature, which is different from the first testing temperature, and testing the first portion of the second subgroup at the first testing temperature; and during a fourth testing cycle, testing the first portion of the first subgroup at the second testing temperature, and ramping the first portion of the second subgroup from the first testing temperature to the second testing temperature. The method further includes during a fifth testing cycle, testing the first portion of the second subgroup at the second testing temperature; and removing the first portion of the first subgroup from the first handler test site, and removing the first portion of a second subgroup from the second handler test site.

In another embodiment, the method also includes binning the first portion of the first subgroup and the first portion of the second subgroup; and compiling testing results for the first portion of the first subgroup and the first portion of the second subgroup In a further embodiment, the method further includes during the fifth testing cycle, ramping the first portion of the first subgroup to a third testing temperature, which is different from the first testing temperature and the second testing temperature; during a sixth testing cycle, testing the first portion of the first subgroup at the third testing temperature, and ramping the first portion of the second subgroup to the third testing temperature; and during a seventh testing cycle, testing the first portion of the second subgroup at the third testing temperature.

In an embodiment, the method includes during the seventh testing cycle, ramping the first portion of the first subgroup to the ambient temperature; and during an eighth testing cycle, ramping the first portion of the second subgroup to the ambient temperature.

In another embodiment, the handler performs physical binning and compiles binning results.

In a further embodiment, the tester compiles software data binning and Standard Test Data Logging (STDF).

In an embodiment, the single insertion testing sequence entirely eliminates the tester index time when the testing time is equal to or greater than the ramping times.

In another embodiment, the single insertion testing sequence substantially reduces the tester index time when the testing time is less that the ramping times.

In a further embodiment, the second testing temperature and the third testing temperature include a temperature lower than the ambient temperature and a temperature higher than the ambient temperature.

In an embodiment, the Standard Test Data Logging (STDF) is performed during each single insertion testing sequence and is augmented with additional data, including (1) the identification of the group and subgroups of semiconductors undergoing testing; (2) the temperature(s) of the active subgroup undergoing a temperature test; and (3) timestamp information inserted at designated testing cycles.

In another embodiment, the binning includes (1) a bin for semiconductors that pass both the first temperature test and the second temperature test; (2) a bin for semiconductors that pass the first temperature test, but fail the second temperature test; (3) a bin for semiconductors that fail the first temperature test, but pass the second temperature test; and a bin for semiconductors that fail both the first temperature test and the second temperature test.

In a further embodiment, the method includes during the seventh testing cycle, ramping the first portion of the first subgroup to a next testing temperature; and continuing executing consecutive testing cycles with parallel testing and ramping until an nth temperature test has been completed, wherein n represents a number of different temperatures that the semiconductors need to be tested, according to a particular testing protocol.

In an embodiment, a non-transitory, computer-readable storage medium is provided having one or more computer programs stored therein for performing semiconductor testing at multiple temperatures during a single semiconductor insertion testing sequence at a handler, which when executed by a computer, causes operations to be performed. The operations include dividing a group of semiconductors having an ambient temperature into a first subgroup having a plurality of portions and a second subgroup having a plurality of portions. Additionally, the operations include during a first testing period, inserting a first portion of the first subgroup into a first handler test site, and inserting a first portion of a second subgroup into a second handler test site; and during a second testing cycle, testing the first portion of the first subgroup at a first testing temperature, which is the ambient temperature. The operations also include during a third testing cycle, ramping the first portion of the first subgroup from the first testing temperature to a second testing temperature, which is different from the first testing temperature, and testing the first portion of the second subgroup at the first testing temperature; and during a fourth testing cycle, testing the first portion of the first subgroup at the second testing temperature, and ramping the first portion of the second subgroup from the first testing temperature to the second testing temperature. The operations further include during a fifth testing cycle, testing the first portion of the second subgroup at the second testing temperature; and removing the first portion of the first subgroup from the first handler test site, and removing the first portion of a second subgroup from the second handler test site.

In another embodiment, the operations further include binning the first portion of the first subgroup and the first portion of the second subgroup; and compiling testing results for the first portion of the first subgroup and the first portion of the second subgroup.

In a further embodiment, the operations include during the fifth testing cycle, ramping the first portion of the first subgroup to a third testing temperature, which is different from the first testing temperature and the second testing temperature. The operations also include during a sixth testing cycle, testing the first portion of the first subgroup at the third testing temperature, and ramping the first portion of the second subgroup to the third testing temperature. The operations further include during a seventh testing cycle, testing the first portion of the second subgroup at the third testing temperature.

In an embodiment, operations include during the seventh testing cycle, ramping the first portion of the first subgroup to the ambient temperature; and during an eighth testing cycle, ramping the first portion of the second subgroup to the ambient temperature.

In another embodiment, operations include during the seventh testing cycle, ramping the first portion of the first subgroup to a next testing temperature. The operations also include continuing executing consecutive testing cycles with parallel testing and ramping until an nth temperature test has been completed, wherein n represents a number of different temperatures that the semiconductors need to be tested, according to a particular testing protocol.

In a further embodiment, the single insertion semiconductor testing entirely eliminates tester index time when the temperature testing periods are equal to or greater in duration than corresponding temperature ramping periods.

In an embodiment, the single insertion semiconductor testing substantially reduces tester index time when the temperature testing periods are shorter in duration than corresponding temperature ramping periods.

In another embodiment, the handler performs physical binning and compiles binning results, whereas the tester compiles software data binning and Standard Test Data Logging (STDF). The Standard Test Data Logging (STDF) is performed during each single insertion testing sequence and is augmented with additional data, including (1) the identification of the group and subgroups of semiconductors undergoing testing; (2) the temperature of the subgroup undergoing a temperature testing period; and (3) timestamp information inserted for temperature testing periods and temperature ramping periods.

DETAILED DESCRIPTION

Figure 1:
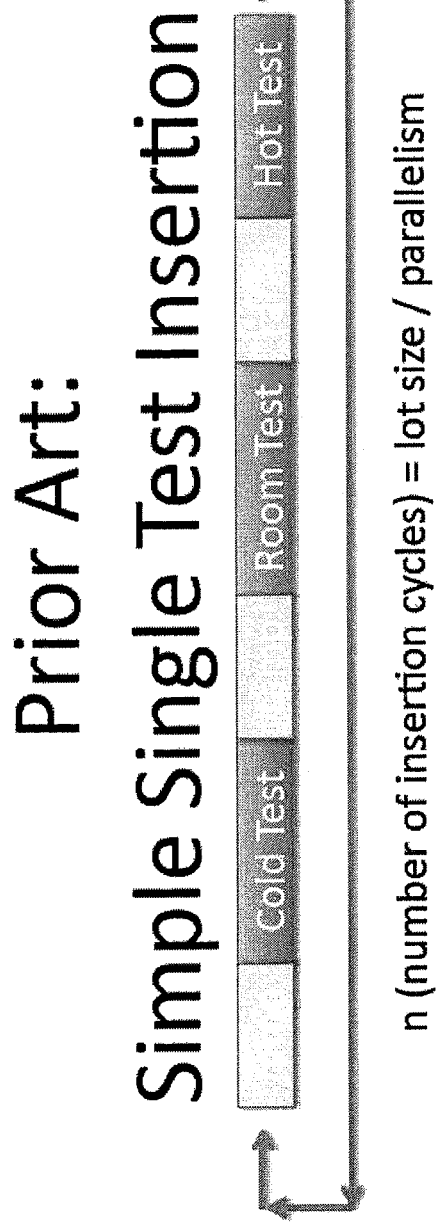
FIG. 1 provides an illustration of a prior art simple single test insertion protocol, in which testing is performed at three different temperatures.

In view of the foregoing, the present disclosure, through one or more of its various aspects, embodiments and/or specific features or sub-components, is thus intended to bring out one or more of the advantages as specifically noted below. The present disclosure provides a description of a method for performing continuous semiconductor tester operation using multiple temperatures during a single semiconductor insertion test, which is characterized by substantially reducing index time, and in some operational configurations, entirely eliminating index time.

For instance, this type of a testing protocol eliminates semiconductor lot processing and staging between temperature tests, thereby reducing the overall time to fully test product devices. This protocol also reduces robotic handling, thereby reducing the potential for electrostatic discharge damage (ESD) and mechanical damage to the semiconductor device. Semiconductor device insertions into testing sockets are reduced, thereby increasing the test cycle lifetime of the test sockets and the moving parts inside the robotic handler. All but one index time is eliminated in multiple test flow scenarios. The precision of the test data is also improved due to the fact that only one semiconductor tester is involved, thereby eliminating tester-to-tester variations when multiple semiconductor testers are used. This protocol greatly simplifies data management and substantially improves data utility, since data from multiple temperature tests is traceable to a single testing device, test socket, device interface board (DIB), robotic handler, and tester minimal post-processing overhead.

However, there are special considerations for semiconductor testing involving continuous semiconductor tester operations during multiple state temperature testing. For instance, the robotic handler must be able to ramp to multiple temperatures (i.e., increase or decrease from one temperature level to a different temperature level) while the semiconductor device remains inserted into a testing socket. Additionally, the ramp time must be short enough in duration so that the benefits of single insertion testing are not significantly diluted by the additional ramp time. Binning must also be managed to compile multiple test results into a final composite outcome. Furthermore, the tester must be able to support the additional computer code and test vector load. The communication interface must support commands to sequence multiple temperature ramps that are test site specific. The test program must also be able to execute the multiple tests in sequence and compile the final software bin result based on the outcome of each individual temperature test. Further for optimal efficiency, each robotic handler needs to be able to control multiplexing of multiple semiconductor test groups during execution of the testing protocol.

In the invention, the temperature ramp time for each testing sequence can be "masked," i.e., operationally hidden, if the testing methodology is engineered such that the semiconductor tester is operationally testing a subgroup of semiconductor devices during each temperature ramping period. One solution to performing this type of testing methodology is to utilize multiplexing between a subgroup of semiconductor test sites performing ramping and a different subgroup of test sites performing testing. In a testing system configured with one robotic handler that tests two subgroups simultaneously, the robotic handler to support twice the executed parallelism of the semiconductor application testing program. Thus, the robotic handler in this dual subgroup testing configuration would result in the insertion of twice the number of semiconductor devices into handler testing sockets at a given time than a robotic handler in a single group testing configuration.

In the robotic handler dual subgroup testing configuration, the ramping time can be full masked when the operational testing time is equal in duration or longer in duration than the ramping time. In other testing protocols, the ramping time can be substantially masked when the operations testing time is shorter in duration than the ramping time.

In semiconductor testing using the robotic handler dual subgroup testing configuration, the semiconductor insertion testing sequence preferably starts at room (i.e., ambient) temperature, since this starting temperature avoids an initial unmasked ramping period at the start of the insertion testing sequence.

In this configuration, the two subgroups of semiconductor testing sockets have identical pin mappings. They also have an identical Time Domain Reflectometry (TDR) which allows the test to launch signals at different times so that signals across all signal paths arrive at the same point in time. After the TDR calibration is completed, the tester can measure signals at different times so that signal across all signal paths are recorded at the same time relative to when they were sent. TDR calibration compensates for signal paths that differ in length.

In the robotic handler dual subgroup testing configuration, the robotic handler controls the multiplexing. The corresponding set of commands handles multiple start of test (SOT) and end of test (EOT) events. This set of commands also controls semiconductor binning, and the different temperature ramp sequencing.

Figure 2:
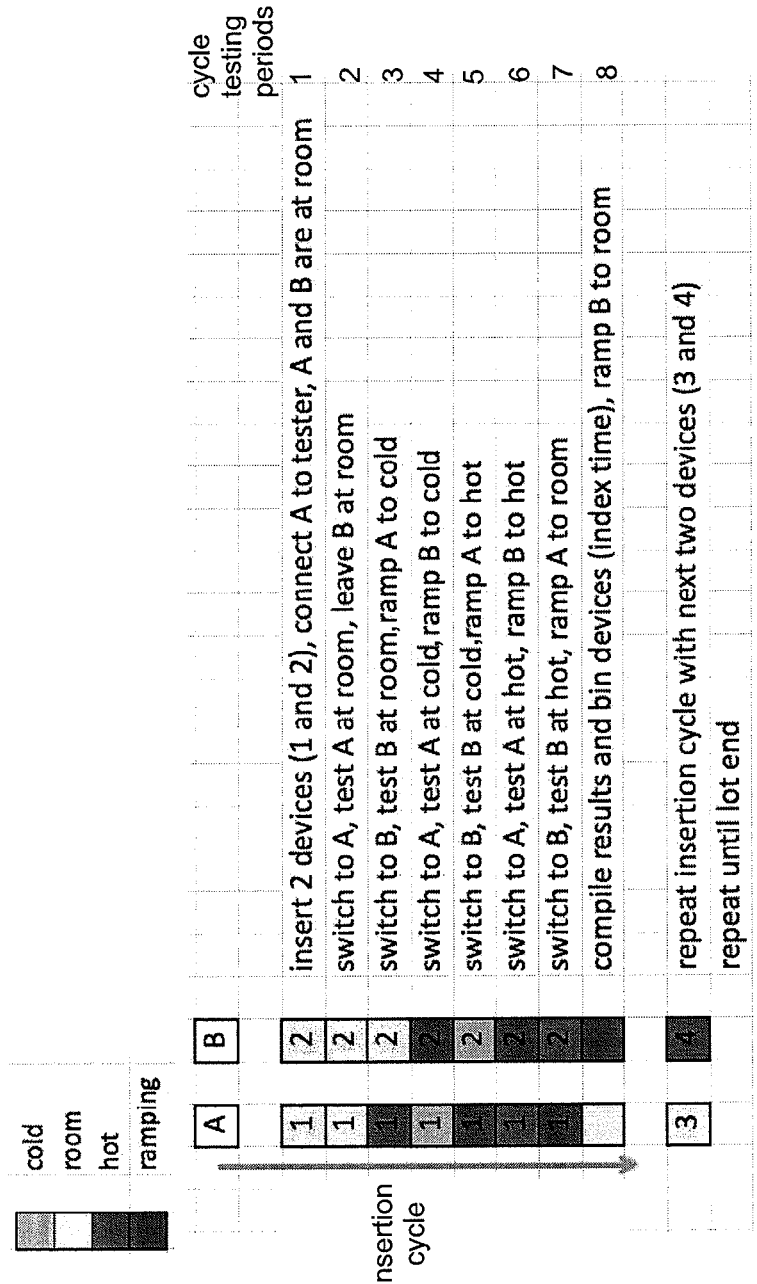
FIG. 2 illustrates an embodiment of the inventive methodology for performing continuous semiconductor tester operation using multiple temperatures during a single semiconductor insertion test.

FIG. 2 illustrates an embodiment of the inventive methodology for performing continuous semiconductor tester operation using multiple temperatures during a single semiconductor insertion test. In this embodiment, the semiconductor testing system is configured with one robotic handler that tests two semiconductor subgroups, identified as "A" and "B," simultaneously. The embodiment illustrated in FIG. 2 is not limiting, as it is an exemplary configuration. Alternatively, the robotic handler may be configured to simultaneously test multiple subgroups greater than two, dependent upon the configuration of the robotic handler testing sites.

In the exemplary embodiment illustrated in FIG. 2, the single testing insertion sequence tests at three separate temperatures, i.e., a cold temperature test, a room temperature test, and a hot temperature test. In between tests conducted at different temperatures, the robotic handler performs a ramping operation, wherein the temperature is either increased or decreased from one temperature to a different temperature. The duration of the ramping period depends upon the operational parameters of the temperature control circuitry, and the differential between a starting temperature and the target temperature.

As discussed previously, the starting temperature of the single insertion testing of semiconductor subgroup A and subgroup B is preferably room temperature. Subgroup A and subgroup B each include a plurality of semiconductor devices to be tested. In order to simplify the discussion of the single insertion testing sequence, however, references in FIG. 2 are made to a single semiconductor device in each of subgroup A and subgroup B. The single semiconductor device in subgroup A is identified a "1" and the single semiconductor device in subgroup B is identified as "2".

In FIG. 2, the single insertion testing sequence identified as the insertion cycle comprises eight (8) cycle testing periods. As illustrated in FIG. 2, during the first cycle testing period, semiconductor device A1 and semiconductor device B2 are at room (i.e., ambient) temperature when they are mechanically inserted into the respective semiconductor testing sites A and B in the robotic handler. Semiconductor device A1 is electrically connected to the tester; Semiconductor device B2 is not electrically connected to the tester.

During the second cycle testing period, the controller operationally switches to semiconductor device A1 and tests semiconductor device A1 at room temperature. Semiconductor device B2 remains at room temperature.

During the third cycle testing period, the controller operationally switches to semiconductor device B2 and tests semiconductor device B2 at room temperature. The temperature of semiconductor A1 is ramped to the cold temperature. It is important to note that during this ramping period, the tester index time is entirely eliminated when the testing time is greater than or equal to the ramping time. When the testing time is less than the ramping time, the index time is not entirely eliminated, but is substantially reduced.

During the fourth cycle testing period, the controller operationally switches to semiconductor device A1 and tests semiconductor device A1 at the cold temperature. The temperature of semiconductor device B2 is ramped to the cold temperature. Once again, the tester index time is entirely eliminated when the testing time is greater than or equal to the ramping time. When the testing time is less than the ramping time, the index time is not entirely eliminated, but is substantially reduced.

During the fifth cycle testing period, the controller operationally switches to semiconductor device B2 and tests semiconductor device B2 at the cold temperature. The temperature of semiconductor device A1 is ramped to the hot temperature. As stated above, the tester index time is entirely eliminated when the testing time is greater than or equal to the ramping time. When the testing time is less than the ramping time, the index time is not entirely eliminated, but is substantially reduced.

During the sixth cycle testing period, the controller operationally switches to semiconductor device A1 and tests semiconductor device A1 at the hot temperature. The temperature of semiconductor device B2 is ramped to the hot temperature. The tester index time is entirely eliminated when the testing time is greater than or equal to the ramping time. When the testing time is less than the ramping time, the index time is not entirely eliminated, but is substantially reduced.

During the seventh cycle testing period, the controller operationally switches to semiconductor device B2 and tests semiconductor device B2 at the hot temperature. The temperature of semiconductor device A1 is ramped to the room temperature. The tester index time is entirely eliminated when the testing time is greater than or equal to the ramping time. When the testing time is less than the ramping time, the index time is not entirely eliminated, but is substantially reduced.

During the final eighth cycle testing period, the controller compiles the results of the signal insertion testing sequence for semiconductor devices A1 and B2, including the testing results for the eight (8) insertion cycle testing periods. During this eighth cycle testing period, semiconductor device B2 is ramped to the room temperature.

At the completion of the eighth cycle testing period, the single insertion testing sequence for semiconductor devices A1 and B2 are completed. This single insertion testing sequence has resulted in each of semiconductors A1 and B2 being tested at three different temperatures, i.e., room temperature, hot temperature, and cold temperature, while mechanically being inserted into the handler tester one time, i.e., a single insertion. Additionally, the single insertion testing sequence has entirely eliminated the tester index time when the testing time is equal to or greater than the ramping times, because the tester is continuously performing testing. Alternatively, the single insertion testing sequence has substantially reduced the tester index time when the testing time is less that the ramping times. The handler performs the physical binning and compiles the binning results, whereas the tester handles the software data binning and the Standard Test Data Logging (STDF).

At this point, as illustrated on the bottom of FIG. 2, the single insertion testing sequence begins a new eight cycle single insertion testing sequence with semiconductors A3 and A4. This process repeats itself until the all of the semiconductor devices in subgroup A and in subgroup B have been fully tested.

In setting up the single insertion testing sequence, as discussed above regarding FIG. 2, a determination must be made as to the number of tests to be performed on the semiconductor subgroups during the single insertion. In this context, the single insertion sequence that tests the semiconductor at different temperatures means that the testing would be performed with a minimum of two different temperatures. However, the testing may be performed using 3, 4, 5, . . . n different temperatures, where n is the number of different temperatures that the semiconductors need to be tested, which is entirely dependent on the particular testing protocol and the temperature tolerance window. Additionally, the degree of parallelism p, where p is the number of subgroups being tested at the same time, must also be determined based on the configuration of the tester and the handler.

Figure 3:
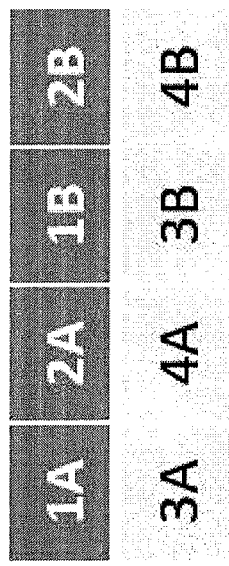
FIG. 3 illustrates an exemplary of the robotic handler setup, which shows a test site layout with two subgroups.

FIG. 3 illustrates an exemplary illustration of a single robotic handler setup for conducting two tests, i.e., Test T1 and Test T2, which shows a handler test site layout with two subgroups, i.e., subgroup A and subgroup B, including four (4) semiconductor test sites in each subgroup. In this illustration, subgroup A includes semiconductors 1A, 2A, 3A, and 4A. Subgroup B includes semiconductors 1B, 2B, 3B, and 4B. Thus, the degree of handler parallelism p is 4 in this illustration. Communications to and from subgroup A and to and from subgroup B are multiplexed from the handler to a common set of tester resources. The handler is programmed to control the multiplexing involving the connection of the subgroups to the tester. The degree of handler loading determines which subgroup is tested first. The handler must have an electrical connection to the multiplexing interface that switches the multiplexing components. Electrical power to the multiplexing interface is normally supplied by the handler. In this configuration, the handler would ideally have four (4) semiconductor hardware bins, which include (1) a bin for semiconductors that pass both Tests T1 and T2; (2) a bin for semiconductors that pass Test T1, but fail Test T2; (3) a bin for semiconductors that fail Test T1, but pass Test T2; and a bin for semiconductors that fail both Tests T1 and T2. However, in an alternative embodiment, the system may be configured with only two semiconductor hardware bins, which would include (1) a bin for semiconductors that pass both Tests T1 and T2; and (2) a bin for semiconductors that failed either or both of Tests T1 and T2.

In the exemplary illustration of a single robotic handler setup for conducting two tests, i.e., Test T1 and Test T2, which shows a handler test site layout with two subgroups, i.e., subgroup A and subgroup B, including four (4) semiconductor test sites in each subgroup, illustrated in FIG. 3, the semiconductor test program pin map is four (4) times the size of a normal pin map. With regard to the test program execution, two blocks of computer code are executed per single insertion, one block of code controlling semiconductor subgroup testing at a first temperature T1, and a second block of code controlling semiconductor subgroup testing at a second temperature T2.

If both subgroups A and B have active testing sites, then four test cycles are executed during each insertion. The four test cycles would be: (1) Subgroup A, Temperature T1; (2) Subgroup B, Temperature T1; (3) Subgroup A, Temperature T2; and (4) Subgroup B, Temperature T2. However, if only one subgroup (i.e., either subgroup A or subgroup B) has active testing sites, then only two testing cycles are executed during each insertion. The two test cycles would be: (1) Subgroup A or B, Temperature T1; and (2) Subgroup A or B (the subgroup being the same subgroup that was tested during the first test cycle), Temperature T2. In this testing protocol, a test cycle executes only when a subgroup has testing sites ready for testing and the testing temperature complies with the testing protocol.

In the exemplary illustration of a single robotic handler setup for conducting two tests, i.e., Test T1 and Test T2, which shows a handler test site layout with two subgroups, i.e., subgroup A and subgroup B, including four (4) semiconductor test sites in each subgroup, illustrated in FIG. 3, the handler test cycle includes various communications between the handler and the tester. These communications would involve receiving commands from the tester to the handler to insert designated semiconductor devices into the testing site(s) for testing, and the handler receiving requests from the tester requesting confirmation that the semiconductor devise have been inserted into the testing sites and are ready for testing. The handler responds by sending a response to the tester indicating which semiconductor test sites are ready for the start of testing.

When the tester receives the start of testing response from the handler, the tester sends a communication to the handler requesting identification of the active subgroup, the temperature, and the insertion timestamp from the tester, to which the handler provides the requested information. The handler then enters a waiting state, while the tester performs testing. The handler subsequently receives binning information from the tester. Bin data is stored if the bin data is for any first temperature test cycle. Bin data for any second temperature cycle is combined with the first temperature test cycle results, and the aggregate testing results is determined. When bin data has been received for all active subgroups at all designated testing temperatures, the tested semiconductor devices are binned according to the aggregate testing results for all active sites.

With regard to testing temperature control, after being initially programmed, the handler manages temperature ramping without any further instructions from the tester. Temperature ramping always begins on a subgroup as soon as binning data has been received for that subgroup and indexing has started. Control is such that as testing is being performed on one subgroup, the temperature is ramping on the other subgroup. The handler controls the subgroups multiplexing so that the active testing subgroup is always connected to the tester. The handler detects and manages events where only one subgroup is active for any reasons. Temperature ramping is disabled on an inactive subgroup.

Figure 4:
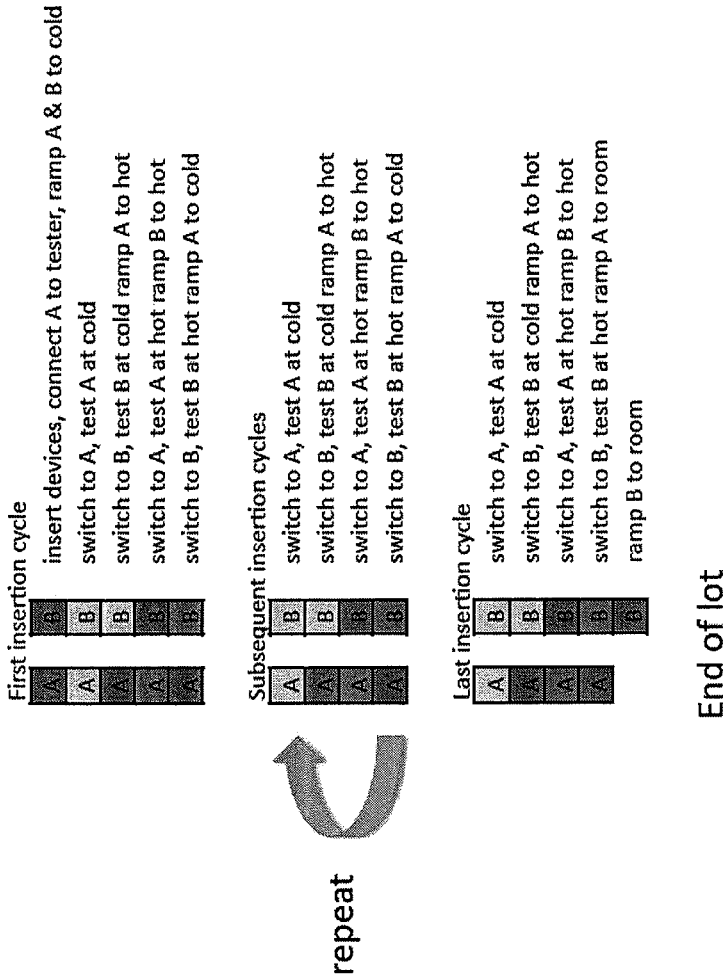
FIG. 4 shows an exemplary illustration of a single robotic handler sequencing test for conducting sequential single insertion semiconductor testing at two different temperatures on semiconductor devices divided into portions of two subgroups.

FIG. 4 shows an exemplary illustration of a single robotic handler sequencing test cycle for conducting sequential single insertion semiconductor testing at two different temperatures, i.e., a cold test (e.g., Test T1) and a hot test (e.g., Test T2), on semiconductor devices divided into portions of two subgroups, i.e., subgroup A and subgroup B. In FIG. 4, the semiconductors are loaded into the handler test site at room (i.e., ambient) temperature. Thus, in the first (i.e., initial) single insertion semiconductor testing, the sequential single insertion cycle includes five (5) testing cycles. In the first testing cycle, the first portions of semiconductor subgroups A and B are mechanically inserted into the testing sites of the handler. The first portion of subgroup A is electrically connected to the tester. Additionally, the first portions of subgroups A and B are ramped to the cold temperature.

In the second testing cycle of the first (i.e., initial) single insertion semiconductor testing, the handler is electrically switched to the first portion of subgroup A, which is tested at the cold temperature. The first portion of subgroup B is awaiting testing.

In the third testing cycle of the first (i.e., initial) single insertion semiconductor testing, the handler switches to the first portion of subgroup B, which is tested at the cold temperature. The first portion of subgroup A is ramped to the hot temperature.

In the fourth testing cycle of the first (i.e., initial) single insertion semiconductor testing, the handler switches to the first portion of subgroup A, which is tested at the hot temperature. The first portion of subgroup B is ramped to the hot temperature.

In the fifth and final testing cycle of the first (i.e., initial) single insertion semiconductor testing, the handler switches to the first portion of subgroup B, which is tested at the hot temperature. When subsequent single insertion semiconductor testing on additional portions of subgroups A and B, during this final testing cycle of the first (i.e., initial) single insertion semiconductor testing, the first portion of subgroup A is binned and the second portion of subgroup A is inserted into the handler testing sites and ramped to the cold temperature.

Once again referring to FIG. 4, during the second and all subsequent single insertion testing, except for the last single insertion testing, during the first testing cycle, the handler switches to the second portion of subgroup A and begins testing at the cold temperature immediately, because the second portion of subgroup A was previously ramped to the cold temperature during the final testing cycle of the first portion of subgroup A, thereby eliminating more index time. During this first testing cycle, the first portion of subgroup B is binned and the second portion of subgroup B is inserted into the handler testing sites and ramped to the cold temperature.

The remaining testing cycles of the second single insertion testing proceed similar to the first single insertion testing. As discussed above, the second single insertion testing, and all subsequent single insertion testing, proceed in this manner except for the last single insertion testing. The lower portion of FIG. 4 illustrates the last single insertion testing. The last single insertion testing begins and proceeds similar to the previously discussed subsequent single insertion testing. However, during the next to last testing cycle, the last portion of subgroup A is ramped to room (i.e., ambient) temperature and binned. Similarly, in the last testing cycle, the last portion of subgroup B is ramped to room temperature and binned. At the completion of the last single insertion testing, the entire group (i.e., lot) of semiconductor, including all of the portions of subgroups A and B, have been fully tested.

With regard to the execution of the testing program for the exemplary embodiment of a single robotic handler setup for conducting two tests, i.e., Test T1 and Test T2, which has a handler test site layout with two subgroups, i.e., subgroup A and subgroup B, including four (4) semiconductor test sites in each subgroup, the testing program includes a pin map four times the size of a normal pin map without parallel testing. The testing program execution loop includes the tester sends a request to the handler requesting the identification of the testing sites that are ready for testing. In response, the tester receives a communication from the handler identifying the testing sites ready for the start of testing. The tester then send a request to the handler for identification of the active subgroup, the temperature, and semiconductor insertion timestamp. Upon receipt of this information from the handler, the tester confirms whether the temperature is correct, and subsequently executes the test sequence for the confirmed correct temperature. When all testing cycles are completed, the testing concludes with the handler performing the physical binning and compiling the binning results, whereas the tester handles the software data binning, performs the Standard Test Data Logging (STDF), and sends the tested semiconductor bin results to the handler.

The Standard Test Data Logging (STDF) is performed during each single insertion testing with the following additions. When the STDF data file is first opened during a single insertion testing cycle, additional data is written into the record. This additional data includes: (1) the identification of the active group and subgroups undergoing testing; (2) the temperature(s) of the active subgroup undergoing a temperature test; and (3) inserted timestamps. Test data from the multiple temperatures used during the single insertion test are collated for each individual semiconductor device by cross-referencing the insertion timestamps, group/subgroup, temperature, and testing site identifier. In this methodology and system, the usefulness of the STDF data is significantly increased as the data for an individual semiconductor device does not include variations due to different tester hardware, tester calibrations, interface hardware, sockets, handlers, handling between tests, different insertions, and environmental conditions (e.g., temperature, EMI, mechanical vibration docketing, etc.).

Figure 5:
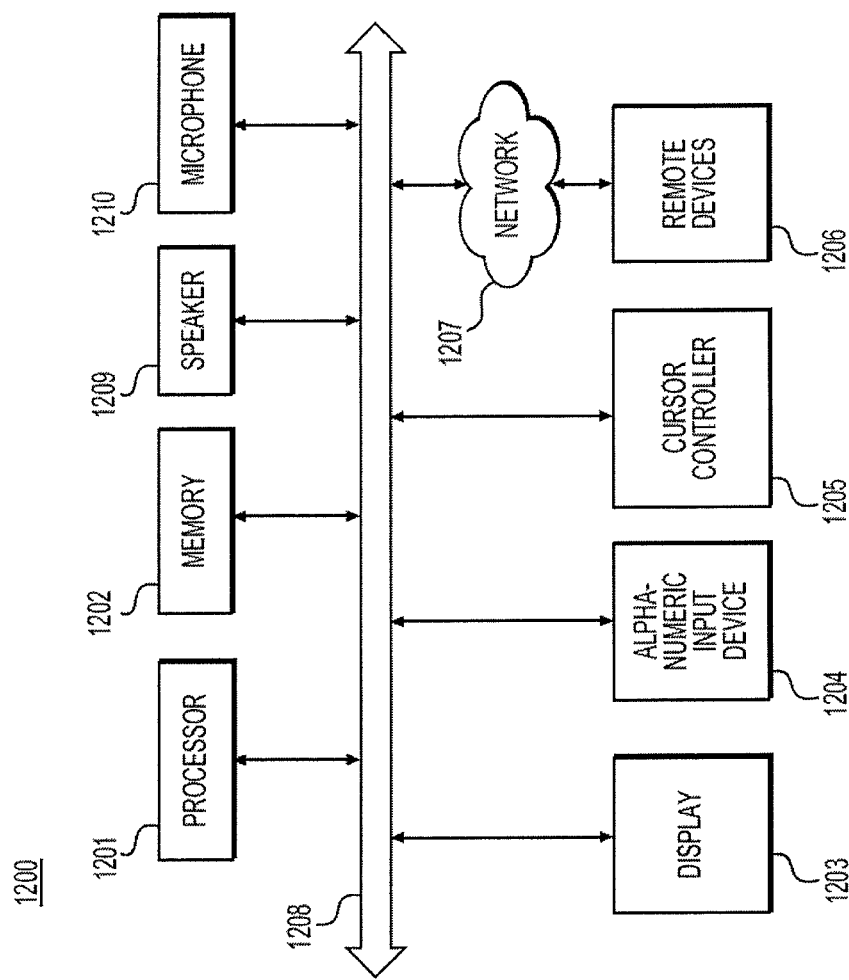
FIG. 5 illustrates an example of a computer that may be used in the semiconductor testing process described herein.

FIG. 5 illustrates an exemplary embodiment of a computer 1200 that may be used in the semiconductor testing process that utilizes automated semiconductor test equipment and robotic handlers. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer utilized in semiconductor test system may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 5, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor, or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for performing semiconductor testing at multiple temperatures during a single insertion semiconductor testing sequence at a handler, the method comprising:
   dividing a group of semiconductors having an ambient temperature into a first subgroup having a plurality of portions and a second subgroup having a plurality of portions;
   during a first testing period, inserting a first portion of the first subgroup into a first handler test site, and inserting a first portion of a second subgroup into a second handler test site;
   during a second testing cycle, testing the first portion of the first subgroup at a first testing temperature, which is the ambient temperature;
   during a third testing cycle, ramping the first portion of the first subgroup from the first testing temperature to a second testing temperature, which is different from the first testing temperature, and testing the first portion of the second subgroup at the first testing temperature;
   during a fourth testing cycle, testing the first portion of the first subgroup at the second testing temperature, and ramping the first portion of the second subgroup from the first testing temperature to the second testing temperature;
   during a fifth testing cycle, testing the first portion of the second subgroup at the second testing temperature; and
   removing the first portion of the first subgroup from the first handler test site, and removing the first portion of a second subgroup from the second handler test site.

2. The method according to claim 1, further comprising:
   binning the first portion of the first subgroup and the first portion of the second subgroup; and
   compiling testing results for the first portion of the first subgroup and the first portion of the second subgroup.

3. The method according to claim 2, further comprising:
   during the fifth testing cycle, ramping the first portion of the first subgroup to a third testing temperature, which is different from the first testing temperature and the second testing temperature;
   during a sixth testing cycle, testing the first portion of the first subgroup at the third testing temperature, and ramping the first portion of the second subgroup to the third testing temperature; and
   during a seventh testing cycle, testing the first portion of the second subgroup at the third testing temperature.

4. The method according to claim 3, further comprising:
during the seventh testing cycle, ramping the first portion of the first subgroup to the ambient temperature; and
during an eighth testing cycle, ramping the first portion of the second subgroup to the ambient temperature.

5. The method according to claim 4,
wherein the handler performs physical binning and compiles binning results.

6. The method according to claim 5,
wherein the tester compiles software data binning and Standard Test Data Logging (STDF).

7. The method according to claim 4,
wherein the single insertion testing sequence entirely eliminates the tester index time when the testing time is equal to or greater than the ramping times.

8. The method according to claim 4,
wherein the single insertion testing sequence substantially reduces the tester index time when the testing time is less that the ramping times.

9. The method according to claim 4,
wherein the second testing temperature and the third testing temperature include a temperature lower than the ambient temperature and a temperature higher than the ambient temperature.

10. The method according to claim 6,
wherein the Standard Test Data Logging (STDF) is performed during each single insertion testing sequence and is augmented with additional data, including (1) the identification of the group and subgroups of semiconductors undergoing testing; (2) the temperature(s) of the active subgroup undergoing a temperature test; and (3) timestamp information inserted at designated testing cycles.

11. The method according to claim 2,
wherein the binning includes (1) a bin for semiconductors that pass both the first temperature test and the second temperature test; (2) a bin for semiconductors that pass the first temperature test, but fail the second temperature test; (3) a bin for semiconductors that fail the first temperature test, but pass the second temperature test; and (4) a bin for semiconductors that fail both the first temperature test and the second temperature test.

12. The method according to claim 3, further comprising:
during the seventh testing cycle, ramping the first portion of the first subgroup to a next testing temperature; and
continuing executing consecutive testing cycles with parallel testing and ramping until an nth temperature test has been completed, wherein n represents a number of different temperatures that the semiconductors need to be tested, according to a particular testing protocol.

13. A non-transitory, computer-readable storage medium having one or more computer programs stored therein for performing semiconductor testing at multiple temperatures during a single insertion semiconductor testing sequence at a handler, which when executed by a computer, causes operations to be performed, the operations comprising:
dividing a group of semiconductors having an ambient temperature into a first subgroup having a plurality of portions and a second subgroup having a plurality of portions;
during a first testing period, inserting a first portion of the first subgroup into a first handler test site, and inserting a first portion of a second subgroup into a second handler test site;
during a second testing cycle, testing the first portion of the first subgroup at a first testing temperature, which is the ambient temperature;
during a third testing cycle, ramping the first portion of the first subgroup from the first testing temperature to a second testing temperature, which is different from the first testing temperature, and testing the first portion of the second subgroup at the first testing temperature;
during a fourth testing cycle, testing the first portion of the first subgroup at the second testing temperature, and ramping the first portion of the second subgroup from the first testing temperature to the second testing temperature;
during a fifth testing cycle, testing the first portion of the second subgroup at the second testing temperature; and
removing the first portion of the first subgroup from the first handler test site, and removing the first portion of a second subgroup from the second handler test site.

14. The non-transitory, computer-readable storage medium according to claim 13, the operations further comprising:
binning the first portion of the first subgroup and the first portion of the second subgroup; and
compiling testing results for the first portion of the first subgroup and the first portion of the second subgroup.

15. The non-transitory, computer-readable storage medium according to claim 14, the operations further comprising:
during the fifth testing cycle, ramping the first portion of the first subgroup to a third testing temperature, which is different from the first testing temperature and the second testing temperature;
during a sixth testing cycle, testing the first portion of the first subgroup at the third testing temperature, and ramping the first portion of the second subgroup to the third testing temperature; and
during a seventh testing cycle, testing the first portion of the second subgroup at the third testing temperature.

16. The non-transitory, computer-readable storage medium according to claim 15, the operations further comprising:
during the seventh testing cycle, ramping the first portion of the first subgroup to the ambient temperature; and
during an eighth testing cycle, ramping the first portion of the second subgroup to the ambient temperature.

17. The non-transitory, computer-readable storage medium according to claim 15, the operations further comprising:
during the seventh testing cycle, ramping the first portion of the first subgroup to a next testing temperature; and
continuing executing consecutive testing cycles with parallel testing and ramping until an nth temperature test has been completed, wherein n represents a number of different temperatures that the semiconductors need to be tested, according to a particular testing protocol.

18. The non-transitory, computer-readable storage medium according to claim 17,
wherein the single insertion semiconductor testing entirely eliminates tester index time when the temperature testing periods are equal to or greater in duration than corresponding temperature ramping periods.

19. The non-transitory, computer-readable storage medium according to claim 17,
wherein the single insertion semiconductor testing entirely substantially reduces tester index time when the temperature testing periods are shorter in duration than corresponding temperature ramping periods.

20. The non-transitory, computer-readable storage medium according to claim 17, wherein the handler performs physical binning and compiles binning results;

wherein the tester compiles software data binning and Standard Test Data Logging (STDF); and wherein the Standard Test Data Logging (STDF) is performed during each single insertion testing sequence and is augmented with additional data, including (1) the identification of the group and subgroups of semiconductors undergoing testing; (2) the temperature of the subgroup undergoing a temperature testing period; and (3) timestamp information inserted for temperature testing periods and temperature ramping periods.

* * * * *